(12) United States Patent
Cheng et al.

(10) Patent No.: US 10,476,502 B2
(45) Date of Patent: Nov. 12, 2019

(54) CONTROL OF SWITCHES IN A VARIABLE IMPEDANCE ELEMENT

(71) Applicant: Cirrus Logic International Semiconductor Ltd., Edinburgh (GB)

(72) Inventors: Yongjie Cheng, Austin, TX (US); Lei Zhu, Austin, TX (US); Kyehyung Lee, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/582,257

(22) Filed: Apr. 28, 2017

(65) Prior Publication Data

US 2018/0316349 A1 Nov. 1, 2018

(51) Int. Cl.
| | |
|---|---|
| H03K 19/00 | (2006.01) |
| H03K 17/06 | (2006.01) |
| H03K 19/04 | (2006.01) |
| H03F 1/02 | (2006.01) |
| H03G 1/00 | (2006.01) |
| H03K 19/094 | (2006.01) |
| H03F 3/187 | (2006.01) |
| H03F 3/217 | (2006.01) |
| H03F 3/45 | (2006.01) |

(52) U.S. Cl.
CPC ....... *H03K 19/0002* (2013.01); *H03F 1/0277* (2013.01); *H03F 3/187* (2013.01); *H03F 3/2175* (2013.01); *H03F 3/45475* (2013.01); *H03G 1/0035* (2013.01); *H03G 1/0088* (2013.01); *H03K 17/063* (2013.01); *H03K 19/09429* (2013.01); *H03F 2200/03* (2013.01); *H03F 2200/321* (2013.01); *H03F 2203/45528* (2013.01); *H03F 2203/45591* (2013.01)

(58) Field of Classification Search
None
See application file for complete search history.

(56) References Cited

U.S. PATENT DOCUMENTS

| | | | |
|---|---|---|---|
| 2,024,740 A | 12/1935 | McCloskey | |
| 5,245,229 A | 9/1993 | Colvin, Sr. | |
| 5,387,626 A | 2/1995 | Shay et al. | |
| 5,757,220 A * | 5/1998 | Murden | H03G 1/0088 327/306 |
| 6,462,621 B1 | 10/2002 | Charles et al. | |
| 6,664,811 B1 | 12/2003 | Bridgewater, Jr. | |
| 6,680,640 B1 * | 1/2004 | Behzad | H03G 1/0088 327/308 |
| 2010/0013454 A1 * | 1/2010 | Dreps | G11O 5/04 323/364 |

(Continued)

FOREIGN PATENT DOCUMENTS

JP 2007/158567 A 6/2007

OTHER PUBLICATIONS

U.S. Appl. No. 62/446,450, Digital Pulse Width Modulation (PWM) Modulator Feeding an Analog PWM Modulator of a Class D Amplifier.

(Continued)

*Primary Examiner* — Crystal L Hammond
(74) *Attorney, Agent, or Firm* — Jackson Walker L.L.P.

(57) ABSTRACT

In accordance with embodiments of the present disclosure, a system may include a buffer and a switch coupled between the buffer and a voltage supply such that the switch controls a varying voltage at a varying voltage node coupled to the buffer.

16 Claims, 2 Drawing Sheets

(56) References Cited

U.S. PATENT DOCUMENTS

2012/0306575 A1* 12/2012 Shah .................. H03F 3/005
330/260

OTHER PUBLICATIONS

Combined Search and Examination Report, UKIPO, Application No. GB1712339.9, dated Feb. 1, 2018.
Partial International Search Report and Provisional Written Opinion of the International Searching Authority, International Application No. PCT/US2018/029761, dated Jul. 17, 2018.
International Search Report and Written Opinion of the International Searching Authority, International Application No. PCT/US2018/029761, dated Oct. 10, 2018.

* cited by examiner

CONTROL OF SWITCHES IN A VARIABLE IMPEDANCE ELEMENT

FIELD OF DISCLOSURE

The present disclosure relates in general to circuits for audio devices, including without limitation personal audio devices such as wireless telephones and media players, and more specifically, to controlling switches of a variable impedance element in a circuit, such as an amplifier.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Oftentimes, such power amplifier is implemented using, in addition to other circuit elements (e.g., operational amplifiers, etc.), variable impedances (e.g., electrical resistances) to set a controllable gain of the power amplifier. In traditional approaches, such variable electrical resistances are implemented using a chain of series-coupled resistive elements with a plurality of gain switches each configured to electrically bypass a particular number of the resistive elements. However, such approaches may have disadvantages, including possible overstressing of the gate nodes of gain switches, especially as device feature sizes of integrated circuits shrink over time.

SUMMARY

In accordance with the teachings of the present disclosure, one or more disadvantages and problems associated with existing approaches to design of variable impedance elements may be reduced or eliminated.

In accordance with embodiments of the present disclosure, a system may include an impedance selector, a first switch coupled between the impedance selector and a voltage supply, and a second switch coupled between the impedance selector and the voltage supply, such that the first switch and the second switch control a varying voltage at a varying voltage node coupled to an output of the impedance selector.

In accordance with these and other embodiments of the present disclosure, a tri-state buffer may include a signal input for receiving an input signal, a signal output for generating an output signal, an inverter comprising a p-type field effect transistor in series with an n-type field effect transistor and configured to generate the output signal as a function of the input signal when the tri-state buffer is enabled, and a second n-type field effect transistor coupled in series between the p-type field effect transistor and a source voltage of the tri-state buffer such that a cathode of a body diode of the second n-type field effect transistor and a cathode of a body diode of the p-type field effect transistor share a common electrical node, wherein the second n-type field effect transistor is configured to selectively enable and disable the tri-state buffer responsive to an enable signal received at a gate of the second n-type field effect transistor, such that the output signal is a function of the input signal when the tri-state buffer is enabled and such that the second n-type field effect transistor is disabled and the signal output is placed in a high-impedance state when the tri-state buffer is disabled.

In accordance with these and other embodiments of the present disclosure, a method may include coupling a first switch between an impedance selector and the voltage supply and coupling a second switch between the impedance selector and the voltage supply, such that the first switch and the second switch control a varying voltage at a varying voltage node coupled to an output of the impedance selector.

In accordance with these and other embodiments of the present disclosure, a method for implementing a tri-state buffer may include coupling a p-type field effect transistor in series with an n-type field effect transistor to form an inverter such that the inverter is configured to generate an output signal as a function of an input signal when the tri-state buffer is enabled, and coupling a second n-type field effect transistor coupled in series between the p-type field effect transistor and a source voltage of the tri-state buffer such that a cathode of a body diode of the second n-type field effect transistor and a cathode of a body diode of the p-type field effect transistor share a common electrical node, wherein the second n-type field effect transistor is configured to selectively enable and disable the tri-state buffer responsive to an enable signal received at a gate of the second n-type field effect transistor, such that the output signal is a function of the input signal when the tri-state buffer is enabled and such that the second n-type field effect transistor is disabled and the signal output is placed in a high-impedance state when the tri-state buffer is disabled.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The analog path portion may include a TCFC amplifier to receive an analog signal generated by the digital path portion and apply a gain to the analog signal to generate an output signal, wherein said output signal may be communicated to a loudspeaker for playback and/or to other circuitry for processing.

Figure 1:
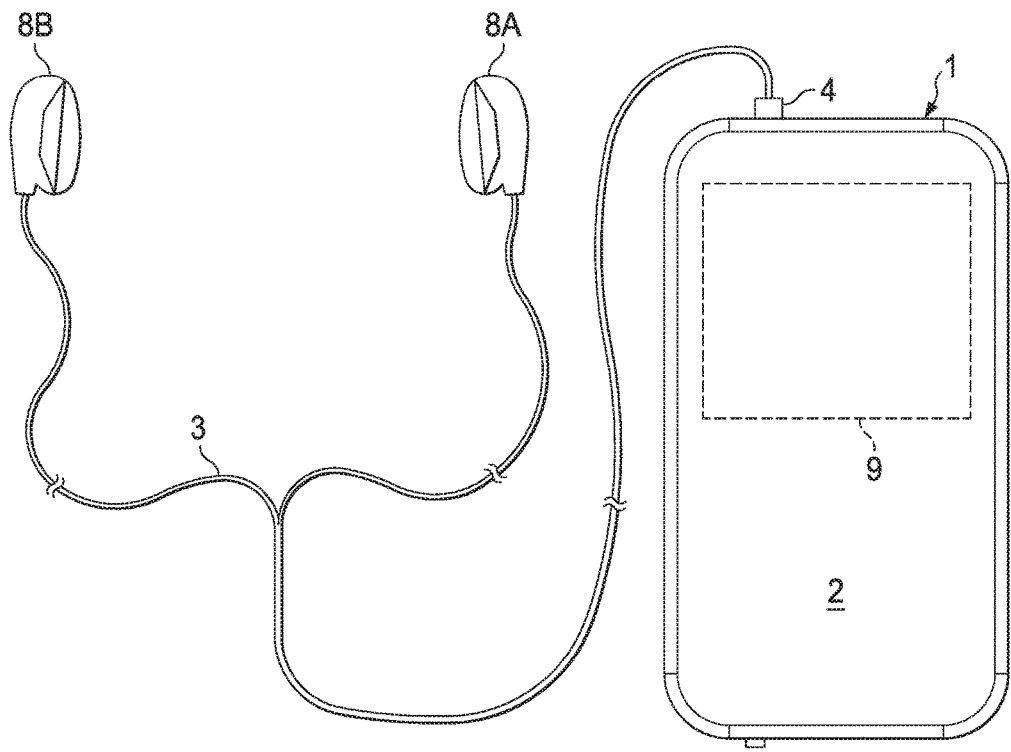
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
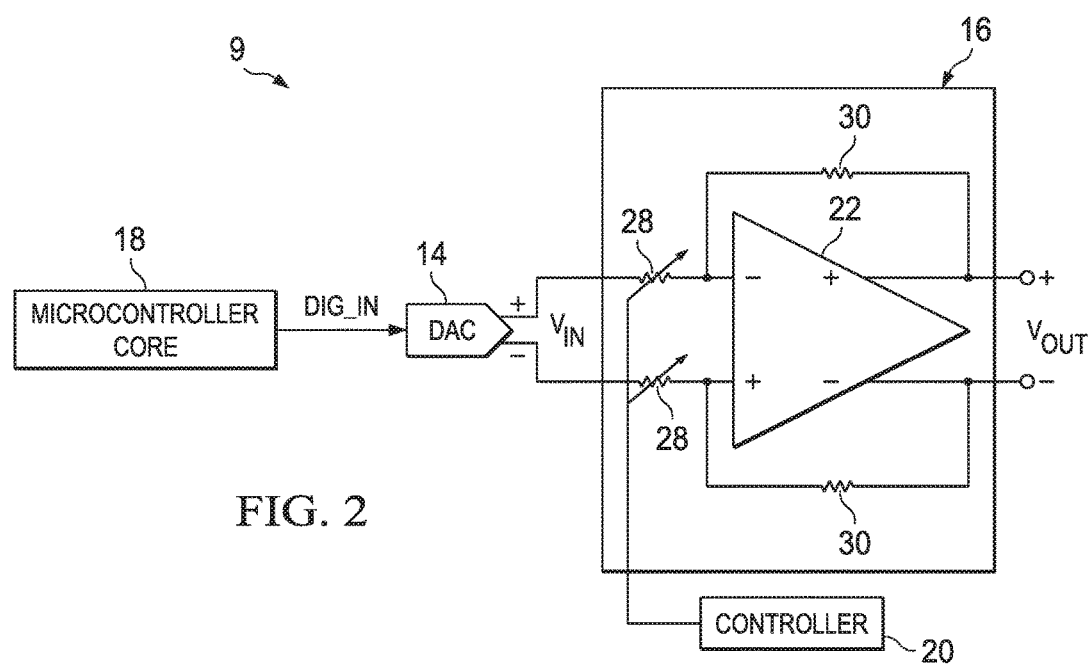
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an intermediate analog signal $V_{IN}$.

DAC 14 may supply intermediate analog signal $V_{IN}$ to an amplifier 16 which may amplify or attenuate audio input signal $V_{IN}$ in conformity with a gain to provide an audio output signal $V_{OUT}$, which may operate a speaker, headphone transducer, a line level signal output, and/or other suitable output. Amplifier 16 may comprise an operational amplifier 22, input resistors 28, and feedback resistors 30 coupled together as shown in FIG. 2. Amplifier 16 may include any suitable circuit for amplifying an electrical signal, including without limitation a Class-AB amplifier and a Class-D amplifier.

As shown in FIG. 2, input resistors 28 may each have a variable, controllable resistance, controlled by a controller 20. Accordingly, by varying the variable resistances of input resistors 28, controller 20 may vary a gain of amplifier 16. Although resistors 30 are depicted in FIG. 2 as having fixed resistances for the purpose of descriptive clarity, in some embodiments, feedback resistors 30 may also have variable, controllable resistances which may be varied in lieu of or in addition to the variable resistances of input resistors 28 to control a gain of amplifier 16.

Figure 3:
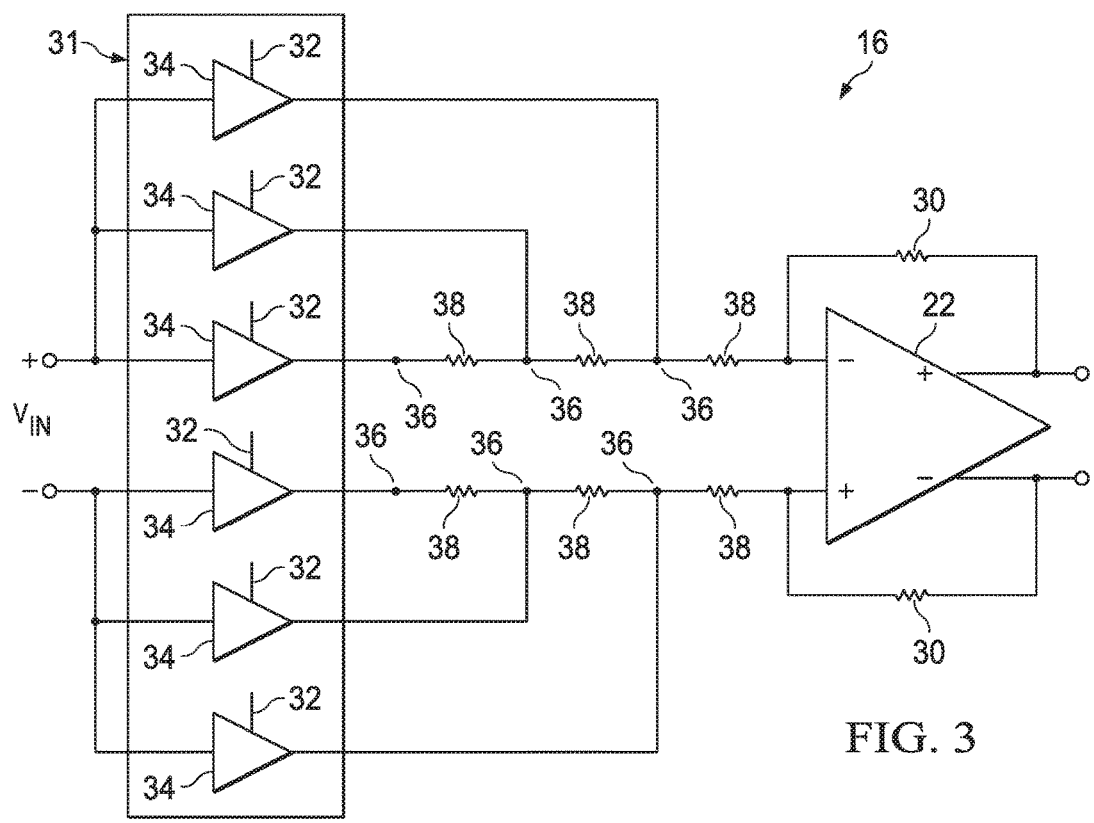
FIG. 3 is a block diagram of selected components of an example amplifier for use in the audio integrated circuit of FIG. 2, in accordance with embodiments of the present disclosure.

FIG. 3 is a block diagram of selected components of an example amplifier 16 for use in the audio integrated circuit of FIG. 2, in accordance with embodiments of the present disclosure. Amplifier 16 depicted in FIG. 3 may be used to implement amplifier 16 depicted in FIG. 2. As shown in FIG. 2, each input resistor 28 may be implemented as a string of series coupled resistive elements 38 having a plurality of tap points 36 located between adjacent resistive elements, and a plurality of tri-state buffers 34 each coupled at their inputs to an input of amplifier 16 coupled at their respective outputs to respective tap points 36. Together, tri-state buffers 34 may be considered and impedance selector for selecting an input impedance (and thus a gain) of amplifier 16. In operation, to set a desired gain for amplifier 16, one of the plurality of tri-state buffers 34 coupled to an amplifier input may be enabled while the rest of the plurality of tri-state buffers 34 coupled to the same amplifier input may be disabled. A tri-state buffer 34 may be selectively enabled and disabled via an individual enable signal for such tri-state buffer 34 communicated from controller 20 and received by an enable input 32 for such tri-state buffer 34 (actual connections from controller 20 to various enabled inputs not shown for purposes of descriptive clarity). Although FIG. 3 depicts a particular number of tri-state buffers 34, tap points 36, and resistive elements 38 for the purposes of descriptive clarity, amplifier 16 may include any suitable numbers of tri-state buffers 34, tap points 36, and resistive elements 38.

Figure 4:
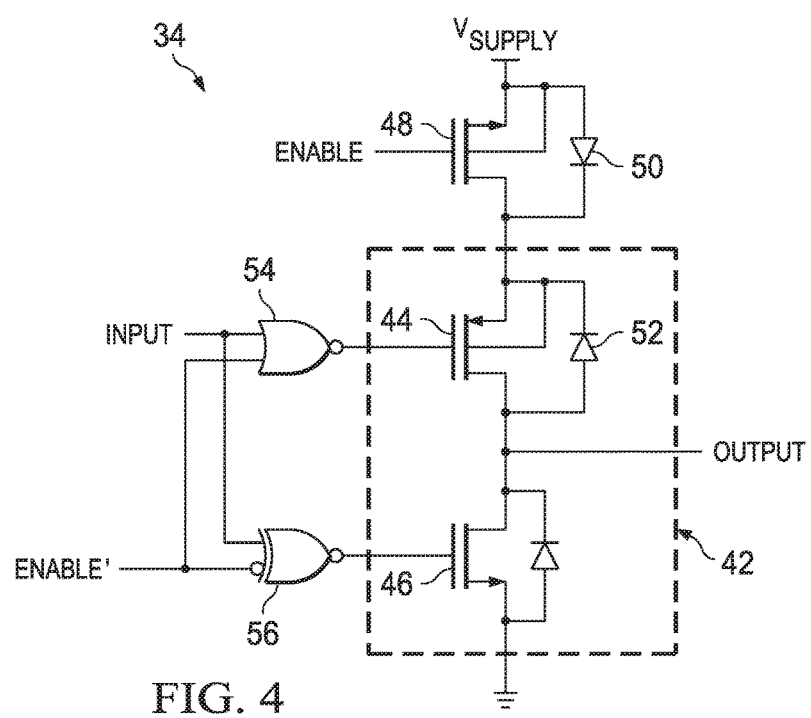
FIG. 4 is a circuit diagram of selected components of an example tri-state buffer for use in the amplifier of FIG. 3, in accordance with embodiments of the present disclosure.

FIG. 4 is a circuit diagram of selected components of an example tri-state buffer 34 for use in amplifier 16 of FIG. 3, in accordance with embodiments of the present disclosure. As shown in FIG. 4, tri-state buffer 34 may include a signal input for receiving an input signal INPUT (which in amplifier 16, may be coupled to either of the positive or negative terminal for intermediate analog signal $V_{IN}$), a signal output for generating an output signal (which in amplifier 16, may be coupled to either of the positive or negative terminal for audio output signal $V_{OUT}$), an inverter 42 comprising a p-type field effect transistor 44 in series with an n-type field effect transistor 46 and configured to generate output signal OUTPUT as a function of input signal INPUT when tri-state buffer 34 is enabled by way of an enable signal ENABLE having a logic "1" value (and its complement ENABLE' having a logic "0" value), and a second n-type field effect transistor 48 coupled in series between p-type field effect transistor 44 and a source voltage $V_{SUPPLY}$ of tri-state buffer 34 such that a cathode of a body diode 50 of second n-type field effect transistor 48 and a cathode of a body diode 52 of p-type field effect transistor 44 share a common electrical node. Further, second n-type field effect transistor 48 may be configured to selectively enable and disable tri-state buffer 34 responsive to enable signal ENABLE being received at a gate terminal of second n-type field effect transistor 48, such that output signal OUTPUT is a function of input signal INPUT when tri-state buffer 34 is enabled and such that second n-type field effect transistor 48 is disabled (e.g., turned off, deactivated, opened) and the signal output is placed in a high-impedance state (e.g., no conductive path between the signal output and source voltage $V_{SUPPLY}$ due to disabling of second n-type field effect transistor 48) when tri-state buffer 34 is disabled. As shown in FIG. 4, tri-state buffer 34 may also be configured such that input signal INPUT is gated (e.g., with logic gates 54 and 56) with enable signal ENABLE (e.g., or its logical complement ENABLE') such that p-type field effect transistor 44 and n-type field effect transistor 46 are disabled (e.g., turned off, deactivated, opened) such that the signal output is placed in a high-impedance state (e.g., no conductive path between the signal output and ground voltage due to disabling of n-type field effect transistor 46) when tri-state buffer 34 is disabled.

Speaking in general terms, this disclosure describes a system including an impedance selector (e.g., impedance selector 31), a first switch (e.g., a switch 48 of a first buffer 34) coupled between the impedance selector and a voltage supply, and a second switch coupled between the impedance selector and the voltage supply (e.g., a switch 48 of a second buffer 34), such that the first switch and the second switch control a varying voltage at a varying voltage node (e.g., one of the input terminals of operational amplifier 22) coupled to an output of the impedance selector. Such impedance selector may include a first buffer (e.g., a first buffer 34) and a second buffer (e.g., a second buffer 34) such that the first switch (e.g., a switch 48 of the first buffer 34) is coupled between the first buffer and the voltage supply, the second switch is coupled between the second buffer and the voltage supply (e.g., a switch 48 of the second buffer 34), and the first switch and the second switch control a varying voltage at a varying voltage node coupled to an output of the first buffer and an output the second buffer. The system may also include a plurality of impedance elements (e.g., resistors 38) coupled between the first buffer and the varying voltage node, wherein at least one of the plurality of impedance elements is coupled between the output of the first buffer and the output the second voltage. As shown in FIGS. 3 and 4 the first buffer and the first switch may be implemented as a first tri-state buffer and the second buffer and the second switch are implemented as a second tri-state buffer.

Also as shown in FIG. 4, each of the first tri-state buffer and the second tri-state buffer may be implemented such that the respective buffer of the respective tri-state buffer comprises an inverter comprising a p-type field effect transistor (transistor 44) in series with an n-type field effect transistor (transistor 46) and is configured to generate the varying voltage as a function of an input signal when the respective tri-state buffer is enabled and the respective switch of the respective tri-state buffer comprises a second n-type field effect transistor (e.g., transistor 48) coupled in series between the p-type field effect transistor and the voltage supply such that a cathode of a body diode (e.g., body diode 50) of the second n-type field effect transistor and a cathode of a body diode of the p-type field effect transistor share a common electrical node. In some embodiments, the second n-type field effect transistor is configured to selectively enable and disable the respective tri-state buffer responsive to an enable signal received at a gate of the second n-type field effect transistor, such that the varying voltage is a function of the input signal when the respective tri-state buffer is enabled and such that the second n-type field effect transistor is disabled and the signal output is placed in a high-impedance state when the respective tri-state buffer is disabled.

In some embodiments, a supply voltage $V_{SUPPLY}$ of the voltage supply may be substantially constant. In these and other embodiments, a switch voltage between a gate terminal and a non-gate terminal of at least one of the first switch (e.g., a switch 48 of a first buffer 34) and the second switch (e.g., a switch 48 of a second buffer 34) is limited to a predetermined magnitude.

Although the tri-state buffer and tri-state buffer controlled variable resistor has been described above as being used in an amplifier, it is noted that the tri-state buffer and/or tri-state buffer controlled variable resistor may be used in any other suitable electrical or electronic system.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system, comprising:
   an impedance selector;
   a first switch coupled between the impedance selector and a voltage supply; and
   a second switch coupled between the impedance selector and the voltage supply, such that the first switch and the second switch control a varying voltage at a varying voltage node coupled to an output of the impedance selector.

2. The system of claim 1, wherein the impedance selector comprises:
   a first buffer; and
   a second buffer;
   such that:
      the first switch is coupled between the first buffer and the voltage supply;
      the second switch is coupled between the second buffer and the voltage supply; and
      the first switch and the second switch control a varying voltage at a varying voltage node coupled to an output of the first buffer and an output of the second buffer.

3. The system of claim 2, further comprising a plurality of impedance elements coupled between an output of the first buffer and the varying voltage node, wherein at least one of the plurality of impedance elements is coupled between the output of the first buffer and the output of the second buffer.

4. The system of claim 2, wherein the first buffer and the first switch are implemented as a first tri-state buffer and the second buffer and the second switch are implemented as a second tri-state buffer.

5. The system of claim 4, wherein for each of the first tri-state buffer and the second tri-state buffer:
   the respective buffer of the respective tri-state buffer comprises an inverter comprising a p-type field effect transistor in series with an n-type field effect transistor and is configured to generate the varying voltage as a function of an input signal when the respective tri-state buffer is enabled; and
   the respective switch of the respective tri-state buffer comprises a second n-type field effect transistor coupled in series between the p-type field effect transistor and the voltage supply such that a cathode of a body diode of the second n-type field effect transistor and a cathode of a body diode of the p-type field effect transistor share a common electrical node.

6. The system of claim 5, wherein the second n-type field effect transistor is configured to selectively enable and disable the respective tri-state buffer responsive to an enable signal received at a gate of the second n-type field effect transistor, such that the varying voltage is a function of the input signal when the respective tri-state buffer is enabled and such that the second n-type field effect transistor is disabled and the signal output is placed in a high-impedance state when the respective tri-state buffer is disabled.

7. The system of claim 1, wherein a supply voltage of the voltage supply is substantially constant.

8. The system of claim 1, wherein a switch voltage between a gate terminal and a non-gate terminal of at least one of the first switch and the second switch is limited to a predetermined magnitude.

9. A method, comprising:
coupling a first switch between an impedance selector and the voltage supply; and
coupling a second switch between the impedance selector and the voltage supply, such that the first switch and the second switch control a varying voltage at a varying voltage node coupled to an output of the impedance selector.

10. The method of claim 9, further comprising implementing the impedance selector such that the impedance selector comprises:
a first buffer; and
a second buffer;
such that:
the first switch is coupled between the first buffer and the voltage supply;
the second switch is coupled between the second buffer and the voltage supply; and
the first switch and the second switch control a varying voltage at a varying voltage node coupled to an output of the first buffer and an output of the second buffer.

11. The method of claim 10, further comprising coupling a plurality of impedance elements between an output of the first buffer and the varying voltage node, wherein at least one of the plurality of impedance elements is coupled between the output of the first buffer and the output of the second buffer.

12. The method of claim 10, further comprising implementing the first buffer and the first switch as a first tri-state buffer and implementing the second buffer and the second switch s a second tri-state buffer.

13. The method of claim 12, wherein for each of the first tri-state buffer and the second tri-state buffer:
the respective buffer of the respective tri-state buffer comprises an inverter comprising a p-type field effect transistor in series with an n-type field effect transistor and is configured to generate the varying voltage as a function of an input signal when the respective tri-state buffer is enabled; and
the respective switch of the respective tri-state buffer comprises a second n-type field effect transistor coupled in series between the p-type field effect transistor and the voltage supply such that a cathode of a body diode of the second n-type field effect transistor and a cathode of a body diode of the p-type field effect transistor share a common electrical node.

14. The method of claim 13, wherein the second n-type field effect transistor is configured to selectively enable and disable the respective tri-state buffer responsive to an enable signal received at a gate of the second n-type field effect transistor, such that the varying voltage is a function of the input signal when the respective tri-state buffer is enabled and such that the second n-type field effect transistor is disabled and the signal output is placed in a high-impedance state when the respective tri-state buffer is disabled.

15. The method of claim 9, wherein a supply voltage of the voltage supply is substantially constant.

16. The method of claim 9, wherein a switch voltage between a gate terminal and a non-gate terminal of at least one of the first switch and the second switch is limited to a predetermined magnitude.

\* \* \* \* \*

UNITED STATES PATENT AND TRADEMARK OFFICE
CERTIFICATE OF CORRECTION

PATENT NO. : 10,476,502 B2
APPLICATION NO. : 15/582257
DATED : November 12, 2019
INVENTOR(S) : Cheng et al.

Page 1 of 1

It is certified that error appears in the above-identified patent and that said Letters Patent is hereby corrected as shown below:

In the Claims

Please amend Claim 12 as follows:
12. The method of Claim 10, further comprising implementing the first buffer and the first switch as a first tri-state buffer and implementing the second buffer and the second switch as a second tri-state buffer.

Signed and Sealed this
Twelfth Day of May, 2020

Andrei Iancu
*Director of the United States Patent and Trademark Office*